United States Patent
Hartmann et al.

(10) Patent No.: US 10,483,244 B2
(45) Date of Patent: Nov. 19, 2019

(54) POWER SEMICONDUCTOR MODULE

(71) Applicant: ABB Schweiz AG, Baden (CH)

(72) Inventors: Samuel Hartmann, Staufen (CH); Franc Dugal, Benglen (CH); Olle Ekwall, Ludvika (SE); Erik Doré, Ludvika (SE)

(73) Assignee: ABB Schweiz AG, Baden (CH)

( * ) Notice: Subject to any disclaimer, the term of this patent is extended or adjusted under 35 U.S.C. 154(b) by 724 days.

(21) Appl. No.: 14/878,466

(22) Filed: Oct. 8, 2015

(65) Prior Publication Data

US 2016/0027762 A1 Jan. 28, 2016

Related U.S. Application Data

(63) Continuation of application No. PCT/EP2014/057012, filed on Apr. 8, 2014.

(30) Foreign Application Priority Data

Apr. 9, 2013 (EP) ..................................... 13162942

(51) Int. Cl.
  *H01L 25/07* (2006.01)
  *H01L 23/051* (2006.01)
  *H01L 23/492* (2006.01)

(52) U.S. Cl.
  CPC .......... *H01L 25/072* (2013.01); *H01L 23/051* (2013.01); *H01L 23/492* (2013.01);
  (Continued)

(58) Field of Classification Search
  None
  See application file for complete search history.

(56) References Cited

U.S. PATENT DOCUMENTS 5,512,790 A 4/1996 Lachenmaier et al.
6,078,066 A * 6/2000 Akamatsu ............. H01L 25/165
                                                           257/177

(Continued)

FOREIGN PATENT DOCUMENTS

DE 19644009 A1 * 5/1998 ............. H01L 25/07
EP 0645814 A2 * 3/1995 ............. H01L 23/66

(Continued)

OTHER PUBLICATIONS

Internation Search Report Application No. PCT/EP2014/057012 Completed: Jul. 8, 2014; dated Aug. 5, 2014 5 Pages.

(Continued)

*Primary Examiner* — Jarrett J Stark
(74) *Attorney, Agent, or Firm* — Whitmyer IP Group LLC

(57) ABSTRACT

A power semiconductor module includes a first main electrode, a second main electrode and a control terminal. The power semiconductor module includes controllable power semiconductor components arranged between the first main electrode and the second main electrode. At least some of the controllable power semiconductor components are arranged in a ring arrangement, wherein the controllable power semiconductor components of the ring arrangement are arranged at least approximately along a first circular line of the ring arrangement, and a control conductor track of the ring arrangement is arranged on the first main electrode, wherein the control conductor track runs at least approximately along a second circular line of the ring arrangement, and the second circular line runs concentrically relative to the first circular line.

9 Claims, 5 Drawing Sheets

(52) U.S. Cl.
CPC ............... *H01L 2224/48091* (2013.01); *H01L 2924/13055* (2013.01)

(56) References Cited

U.S. PATENT DOCUMENTS

| | | | |
|---|---|---|---|
| 6,426,561 B1 | 7/2002 | Lang et al. | |
| 2004/0119089 A1* | 6/2004 | Merlin | H01L 23/051 |
| | | | 257/181 |
| 2015/0029672 A1* | 1/2015 | Nakayama | H02M 7/003 |
| | | | 361/715 |

FOREIGN PATENT DOCUMENTS

| | | | | |
|---|---|---|---|---|
| EP | 0989611 | A2 | 3/2000 | |
| EP | 1403923 | A1 | 3/2004 | |
| EP | 2790217 | A1 * | 10/2014 | ........... H01L 23/051 |
| WO | 2012107482 | A2 | 8/2012 | |

OTHER PUBLICATIONS

International Preliminary Serarch Report & Written Opinion (Translation) Application No. PCT/EP2014/057012 Completed: Oct. 13, 2015 6 Pages.

\* cited by examiner

POWER SEMICONDUCTOR MODULE

FIELD OF THE INVENTION

The present invention relates to a power semiconductor module according to the invention.

BACKGROUND OF THE INVENTION

A power semiconductor module of this type is known from DE 196 44 009 A1.

Further power semiconductor modules are also likewise known from the prior art and described for example in EP 0 989 611 A2, U.S. Pat. No. 6,426,561, EP 1 403 923 A1 or WO 2012/107482 A2. These modules are used for example for power converter installations for high voltage direct current transmission. A power semiconductor module is typically loaded minimally with more than 500 V and with more than 1 kA during operation. When the power semiconductor modules are employed in a power converter installation for high voltage direct current transmission, the power semiconductor modules are connected in series in order to achieve the required blocking voltage.

Between 100 and 1000 power semiconductor modules are typically connected in series.

Furthermore, power semiconductor modules of this type are also used for static VAR compensators.

In the case of the known power semiconductor modules, it proves to be disadvantageous that, on account of the magnetic field that generates a current flow through the power semiconductor modules, the power semiconductor components arranged in the power semiconductor modules are loaded non-uniformly. This can lead, in particular, to an overloading of individual power semiconductor components. Overloading of a power semiconductor component results in the failure of the module in which the overloaded power semiconductor component is arranged.

SUMMARY OF THE INVENTION

It is an object of the present invention to specify a power semiconductor module in which the power semiconductor components are loaded as uniformly as possible.

This object is achieved according to the invention by means of a power semiconductor module. Advantageous developments of the invention are specified in the dependent claims.

The power semiconductor module according to the invention comprises a first main electrode, a second main electrode and a control terminal. Furthermore, the power semiconductor module comprises controllable power semiconductor components arranged between the first main electrode and the second main electrode, wherein each controllable power semiconductor component has a first electrode, a second electrode and a control electrode, and the first electrode of each controllable power semiconductor component is electrically connected to the first main electrode, the second electrode of each controllable power semiconductor component is electrically connected to the second main electrode, and the control electrode of each controllable power semiconductor component is electrically connected to the control terminal. According to the invention, the power semiconductor module is characterized in that at least some of the controllable power semiconductor components are arranged in a plurality of ring arrangements, wherein the controllable power semiconductor components of the respective ring arrangement are arranged at least approximately along a first circular line of the respective ring arrangement, and a control conductor track of the respective ring arrangement is arranged on the first main electrode, wherein the control conductor track of the respective ring arrangement runs at least approximately along a second circular line of the respective ring arrangement, and the second circular line of the respective ring arrangement runs concentrically and outside relative to the first circular line of the respective ring arrangement, wherein the control electrode of each controllable power semiconductor component of the respective ring arrangement is connected via an electrical connection to the control conductor track of the respective ring arrangement, and the control conductor track of the respective ring arrangement is connected via a further electrical connection to the control terminal.

According to the invention, the power semiconductor components are arranged in a plurality of ring arrangements. As a result of the ring arrangements or as a result of the arrangement of the controllable power semiconductor components at least approximately along a circular line, the power semiconductor components of the respective ring arrangement are exposed substantially to an identical or at least similar magnetic field during operation. Furthermore, the control conductor track of the respective ring arrangement runs at least approximately along a second circular line, wherein the second circular line runs concentrically and outside relative to the first circular line. Consequently, into each conductor loop having the control terminal, the control electrode of the respective power semiconductor component, the second electrode of the respective power semiconductor component and the second main electrode, an at least approximately similar magnetic field couples into each of the conductor loops, whereby the switching behavior of the power semiconductor components of the respective ring arrangement is influenced at least approximately identically by the magnetic field.

In comparison with a second circular line that would lie within the first circular line, the embodiment according to the invention leads to a delayed switching behavior of each power semiconductor component owing to the magnetic field being coupled into the conductor loops defined above. This has an expedient effect in particular on the short-circuit behavior of the power semiconductor module.

As a result of the plurality of ring arrangements, an optimum utilization of the space is made possible, on a high power density is achieved.

In accordance with one preferred embodiment of the power semiconductor module, the first circular line is approximated by a first polygon, and the associated second circular line is approximated by a second polygon having the same number of vertices as the first polygon, wherein the vertices of the first polygon are aligned with the vertices of the second polygon.

This embodiment enables, in particular, economic production of the power semiconductor modules, wherein deviations from circular symmetry turn out to have a small effect on the switching behavior.

In accordance with one preferred embodiment of the power semiconductor module, the power semiconductor module has active assemblies, wherein each active assembly has an electrically conductive carrier plate, and the carrier plates of the active assemblies together form the first main electrode. Furthermore, each ring arrangement is divided into ring segments by the active assemblies, wherein the active power semiconductor components of the ring segment are arranged on the carrier plate, and the control conductor track of the respective ring arrangement is subdivided into control conductor track segments of the ring arrangement, wherein the control electrode of each power semiconductor component of the respective ring segment is connected to the control conductor track segment of the respective ring segment.

This embodiment of the power semiconductor module enables economic production since assemblies can be produced and tested. Functional assemblies can be combined to form a power semiconductor module.

In accordance with one preferred embodiment of the power semiconductor module, the ring arrangements do not overlap. In other words, the ring arrangements are free of overlap.

This embodiment enables cost-effective production.

In accordance with one preferred embodiment of the power semiconductor module, all the active power semiconductor components are arranged in the ring arrangement or the ring arrangements.

This embodiment of the power semiconductor module makes it possible to optimize the switching behavior of all the power semiconductor components.

In accordance with one preferred embodiment of the power semiconductor module, the active assemblies of the power semiconductor module are all embodied identically.

This embodiment enables economic production.

In accordance with one preferred embodiment of the power semiconductor module, an electrically conductive contact element is arranged between the second main electrode of the power semiconductor module and each controllable power semiconductor component, said contact element connecting the second main electrode to the second electrode of the power semiconductor component, wherein the contact element and the power semiconductor component define a current carrying direction that is at least approximately at right angles with respect to the first main electrode.

This embodiment of the power semiconductor module makes it possible to realize a stackable module with a comparatively simple construction.

In accordance with a further embodiment of the power semiconductor module, which can be combined with all the other embodiments, the first main electrode is parallel to the second main electrode.

In accordance with one preferred embodiment of the power semiconductor module, each contact element is embodied as a press contact.

This embodiment makes it possible, in an extremely simple manner, to realize an electrical contact by means of pressure wherein a solder or other electrical connection layer can be dispensed with for producing the electrical contact. Furthermore, this embodiment makes it possible to compensate for the different structural heights of the power semiconductor components and of the contact elements. The different structural heights are governed by production. Furthermore, this embodiment, by virtue of the spring travel of the press contact, enables adaptive alignment of the first main electrode relative to the second main electrode.

In accordance with one preferred embodiment of the power semiconductor module, the further electrical connection runs at least substantially parallel to the current carrying direction.

In accordance with one preferred embodiment of the power semiconductor module, the power semiconductor module has a frame composed of insulating material, the active assemblies being inserted into said frame.

By virtue of this embodiment, the power semiconductor module can be constructed economically from active assemblies.

In accordance with one preferred embodiment of the power semiconductor module, the power semiconductor module has a central through hole.

By virtue of this embodiment, power semiconductor modules that are stacked can be braced against one another by means of a rod led through the through holes, as a result of which an optimum contact pressure is produced between adjacent first main electrodes and second main electrodes. Optionally, a heat sink can be arranged between neighboring first main electrode and second main electrode of two power semiconductor modules.

In accordance with a further preferred embodiment of the power semiconductor module, the switchable power semiconductor components are embodied as reverse conducting IGBTs, also designated as RC-IGBTs. Alternatively, conventional IGBTs can also be used, in which case antiparallel power semiconductor diodes should additionally be arranged in relation to the IGBTs. The diodes can be arranged instead of a switchable power semiconductor component, for example. In the embodiments comprising active assemblies, the switchable power semiconductor components of one of the assemblies can be formed by power semiconductor diodes, in which case the construction of the assembly can be simplified since the power semiconductor diodes have no control electrodes. By way of example, in the frame two active assemblies could be equipped with power semiconductor diodes and four active assemblies could be equipped with IGBTs. Other arrangements are also conceivable and obvious to the person skilled in the art.

The abovementioned and further objects, advantages and features of the present invention will become apparent from the following detailed description of preferred embodiments of the invention in conjunction with the drawing.

DETAILED DESCRIPTION OF THE INVENTION

The embodiments described below represent the subject matter of the invention by way of example and have no limiting effect.

Figure 1:
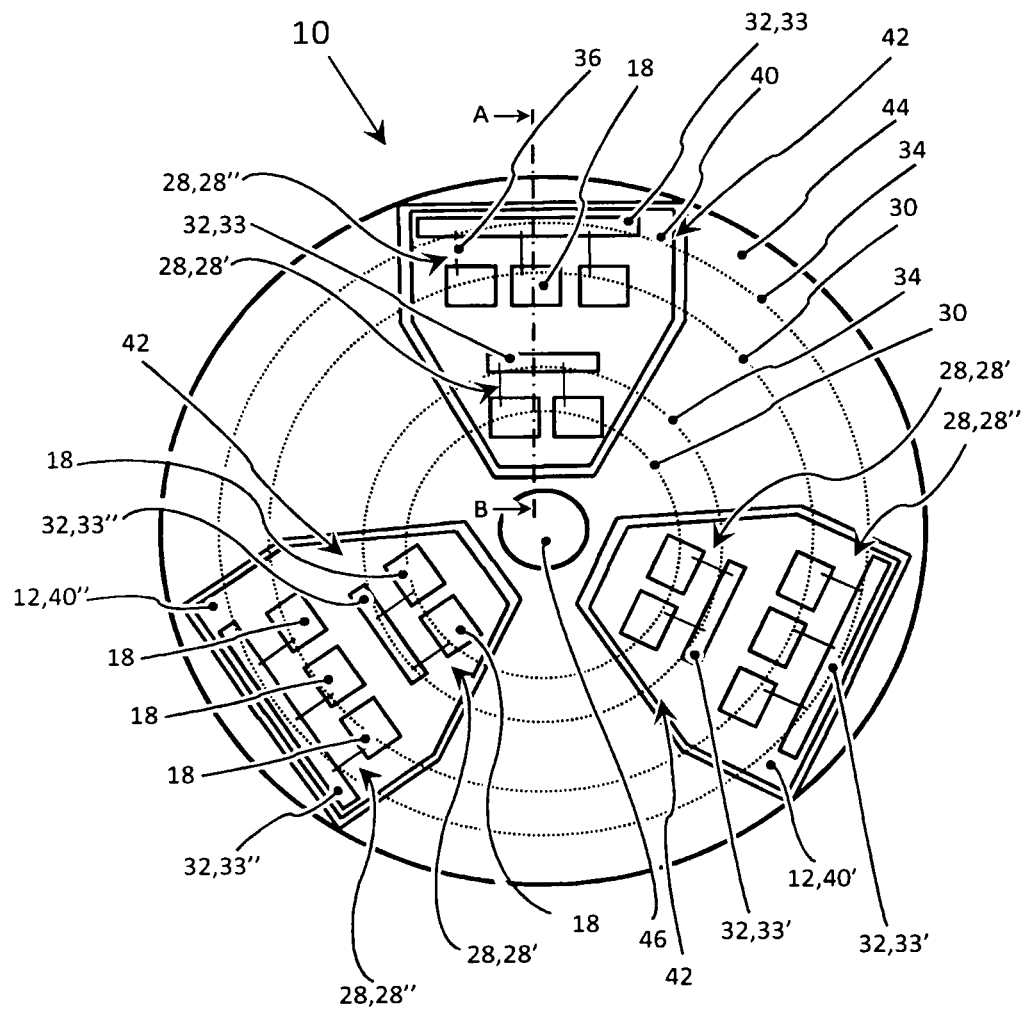
FIG. 1 shows in plan view an open power semiconductor module in accordance with a first embodiment, a second main electrode and a control terminal being removed.
Figure 2:
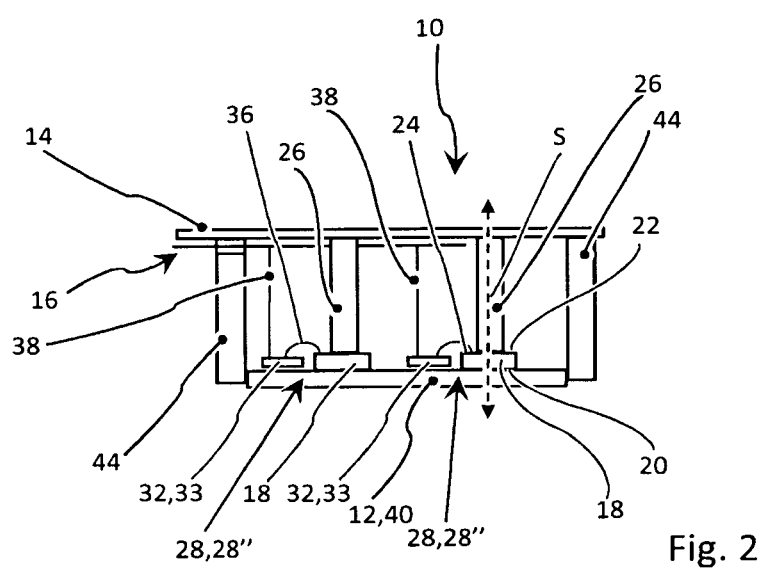
FIG. 2 shows a sectional illustration along the sectional line A-B depicted in FIG. 1, with the second main electrode and the control terminal being shown.

FIG. 1 and FIG. 2 show a first embodiment of a power semiconductor module 10 comprising a first main electrode 12 and a second main electrode 14, which is shown only in FIG. 2. The power semiconductor module 10 furthermore comprises a control terminal 16, shown in FIG. 2, which is arranged on the second main electrode 14 in a manner insulated from the second main electrode 14 in a known way. As shown in FIG. 2, in particular, controllable power semiconductor components 18 are arranged between the first main electrode 12 and the second main electrode 14. Each controllable power semiconductor component 18 has a first electrode 20, a second electrode 22 and a control electrode 24. The first electrode 20 of each controllable power semiconductor component 18 is electrically connected to the first main electrode 12 by means of a connection layer. The connection layer can be formed, for example, by a solder layer or by a connection layer produced by means of a sintering method. The second electrode 22 is electrically connected to the second main electrode 14 via a contact element 26.

As shown in FIG. 1, in particular, the controllable power semiconductor components 18 are arranged in an inner ring arrangement 28' and an outer ring arrangement 28", which are concentric with respect to one another. Instead of these two ring arrangements 28', 28", the power semiconductor components 18 can also be arranged in a plurality of mutually concentric ring arrangements. Ring arrangements are generally designated by the reference sign 28. Furthermore, the individual ring arrangements arranged concentrically with respect to one another do not overlap. They are thus free of overlap.

In each ring arrangement 28, in particular in the inner and outer ring arrangements 28', 28" shown in FIG. 1, the controllable power semiconductor components 18 are arranged along a first circular line 30 of the respective ring arrangement 28. Furthermore, each ring arrangement 28 has a control conductor track 32, which is arranged on the first main electrode 12 in a manner insulated therefrom. The control conductor track 32 of the respective ring arrangement 28 runs along a second circular line 34, wherein the second circular line 34 is situated concentrically with respect to the first circular line 30. As shown in FIG. 1, the control conductor track 32 of the respective ring arrangement 28 is formed by a plurality of control conductor track segments 33, 33', 33". Each control electrode 24 of the controllable power semiconductor components 18 of the ring arrangement 28 is connected via an electrical connection 36, for example via a wire, to the control conductor track 32, wherein the connection 36 preferably runs substantially in a radial direction relative to the first circular line 30 or the second circular line 34.

As shown in FIG. 2, the control conductor track 32 or each control conductor track segment 33, 33', 33" is connected via a further electrical connection 38 to the control terminal 16. Alternatively it is also possible to interconnect the individual control conductor track segments 33, 33', 33" along the second circular line 34 and to connect at least one of the control conductor track segments 33, 33', 33" via the further electrical connection 38 to the control terminal 16.

Furthermore, it is preferred for the further electrical connection 38 to run parallel to a current carrying direction S, defined further below. Alternatively, the further electrical connection 38 can substantially also run on a lateral surface of a circular cylinder situated concentrically with respect to the first circular line 30 or second circular line 34. As a further alternative, it is also conceivable for the further electrical connection to be aligned in each case identically relative to the active assembly 42.

As shown in FIG. 1, the second circular line 34 of the respective ring arrangement 28 lies outside the first circular line 30 of the same ring arrangement 28. To put it another way, the radius of the second circular line 34 is greater than the radius of the first circular line 30.

As is furthermore shown in FIG. 1, the first main electrode 12 is embodied in three parts. In general, the first main electrode 12 can be formed by an arbitrary number of carrier plates which together form the first main electrode 12. In the present exemplary embodiment, the first main electrode 12 is formed by the three carrier plates 40, 40', 40". Active assemblies 42 are formed by the carrier plates 40, 40', 40" in the power semiconductor module 10. Furthermore, each ring arrangement 28, 28', 28" is subdivided into ring segments by the active assemblies 42. As shown in FIG. 1, the inner ring arrangement 28' and also the outer ring arrangement 28" are each divided into three ring segments by the active assemblies.

On a first side of each carrier plate 40, 40', 40" therefore, the active power semiconductor components 18 are arranged and electrically conductively connected thereto. The main electrode 12 is formed, in particular, by that side of the carrier plate which is opposite the first side.

As is furthermore shown in FIG. 1 and also in FIG. 2, the active assemblies 42 are held by a frame 44 or inserted into a frame 44. The frame 44 is produced from an insulating material. FIG. 1 furthermore shows that the power semiconductor module 10 has centrally an optional through hole 46. A rod can be led through said through hole, by means of which rod a plurality of power semiconductor modules 10 stacked one on top of another can be braced against one another.

As is furthermore shown in FIG. 1, all the controllable power semiconductor components 18 are arranged in the ring arrangements 28, 28', 28". However, controllable power semiconductor components 18 can also be arranged outside ring arrangements. In order to increase the performance of the power semiconductor module, instead of the through hole a single power semiconductor component could be arranged in the center of the power semiconductor module.

As is shown in FIG. 2, in particular, the second electrode 22 of each power semiconductor component 18 is contact-connected by the contact element 26. The contact element 26 produces the electrical connection between the second electrode 22 of the power semiconductor component 18 and the second main electrode 14 of the power semiconductor module 10. Furthermore, the contact element 26 is an important element in order that the power semiconductor module 10 in the case of a fault undergoes transition to a conducting state, which is known as the short circuit failure mode (SCFM). This is known from the prior art and is described for example in EP 0 989 611 A2, U.S. Pat. No. 6,426,561, EP 1 403 923 A1 or WO 2012/107482 A2.

The contact element 26 and the power semiconductor component 18 contact-connected by the respective contact element 26 define a current carrying direction S. The latter is at least approximately at right angles with respect to the first main electrode 12.

The contact element 26 can comprise, as described for example in EP 0 989 611 A2, U.S. Pat. No. 6,426,561 or EP 1 403 923 A1, a press contact. The latter can be realized by a spring, as known from the prior art. Furthermore, the contact element 26 can comprise aluminum, silver, gold, copper or magnesium, but also a metal layer composed of some other suitable material, which in the case of a fault enable or support a formation of an electrically conductive connection between the first main electrode 12 and the second main electrode 14. The metal of the metal layer is intended to be able to form a eutectic with the material of the power semiconductor component 18. Furthermore, the thickness of the metal layer must be dimensioned in such a way that in the case of a fault the material of the metal layer can form an electrically conductive channel with the material of the power semiconductor component as is described in the prior art cited. Furthermore, in the contact element 26 a layer can be provided which compensates for thermal stresses on account of temperature fluctuations, such that the semiconductor component 18 is as far as possible not loaded mechanically, on account of thermal fluctuations. This can be achieved by means of a layer having a coefficient of thermal expansion similar to that of the power semiconductor component 18 itself.

Alternatively, the contact element 26 can also be embodied without a press contact or without a spring. Such a contact element is known from WO 2012/107482 A2.

In order to protect the power semiconductor component 18 further against mechanical loads on account of thermal fluctuations, a further layer composed of a material having a coefficient of thermal expansion similar to that of the power semiconductor component 18 can be provided, for example between the power semiconductor component 18 and the first main electrode 12. Alternatively, the first main electrode 12 itself can also be produced from such a material or comprise a layer composed of such a material.

Figure 3:
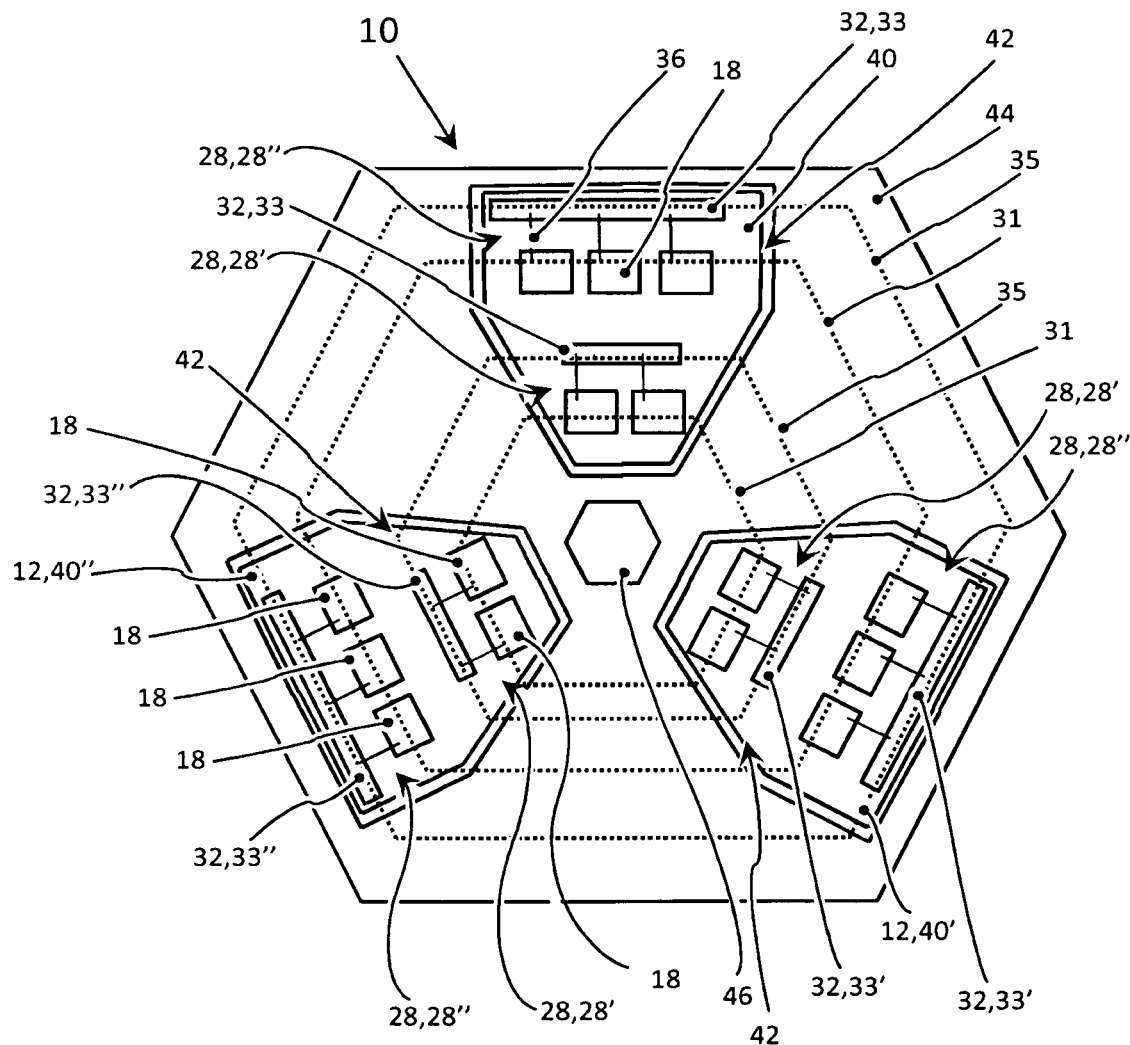
FIG. 3 shows in plan view an open power semiconductor module in accordance with a second embodiment, the second main electrode and the control terminal being removed.

FIG. 3 shows a further embodiment of the invention. This embodiment is designed to be largely identical to the embodiment described above. Only the differences are discussed below. The embodiment shown in FIG. 3 differs from the first embodiment shown in FIGS. 1 and 2 in that the first circular line 30 of each ring arrangement 28 is approximated by a first hexagon 31 and the associated second circular line 34 is approximated by a second hexagon 35, wherein the vertices of the first hexagon are aligned with the vertices of the second hexagon. Furthermore, this embodiment also shows that the frame 44 or the housing of the power semiconductor module 10 can have a hexagonal shape. The through hole 46 can likewise have a hexagonal shape.

In the embodiment shown in FIG. 3, three active assemblies 42 are inserted into the hexagonal power semiconductor module 10. Instead of three active assemblies 42, six active assemblies can also be inserted into the frame 44, as is shown in FIG. 4.

Figure 4:
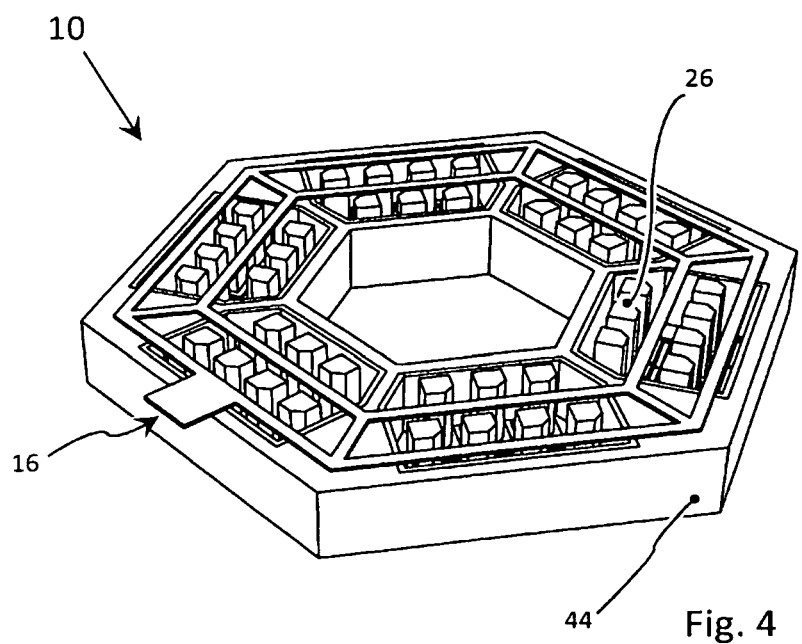
FIG. 4 shows in perspective illustration an open power semiconductor module in accordance with a further embodiment, the second main electrode being removed.
Figure 6:
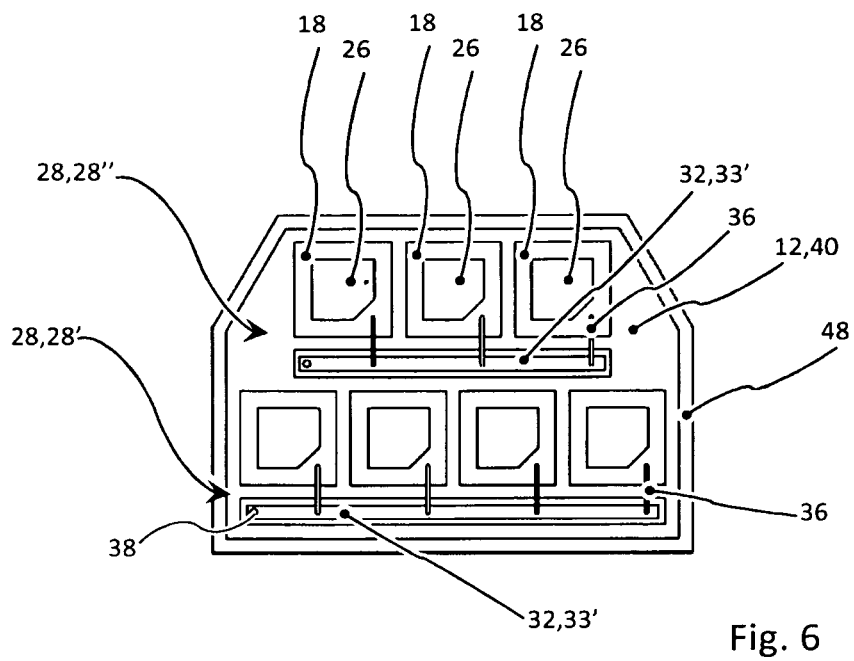
FIG. 6 shows in plan view an active assembly used in the power semiconductor module shown in FIGS. 4 and 5.
Figure 7:
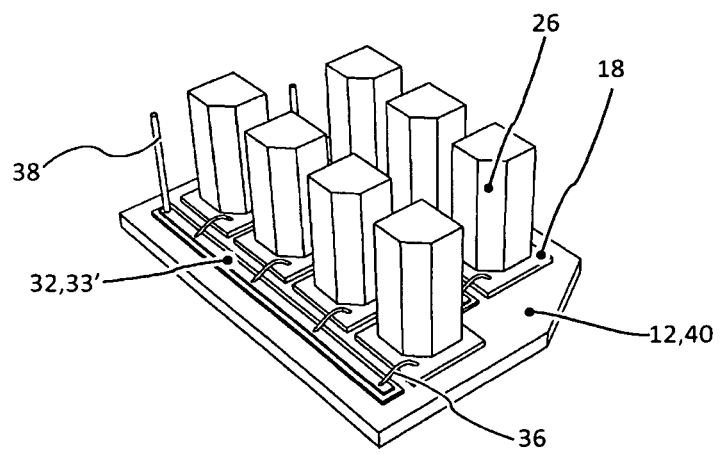
FIG. 7 shows the active assembly shown in FIG. 6 in perspective illustration, an assembly frame not being shown so as to allow a better view of the individual elements of the active assembly.

FIG. 4 shows a further embodiment of the power semiconductor module 10 according to the invention, the active assemblies 42 of which are shown in FIGS. 6 and 7. This embodiment is once again designed to be largely identical to the embodiments described above, and only the differences are discussed below. This embodiment differs from the other embodiments already discussed in the number of power semiconductor components 18 arranged electrically in parallel with one another. Furthermore, this embodiment exhibits an assembly frame 48, which together with the carrier plate 40 forms a type of trough. This trough is preferably filled with an insulating gel, such as silicone gel, for example, or some other insulating material.

Furthermore, FIG. 4 shows an embodiment of the contact terminal 16.

Figure 5:
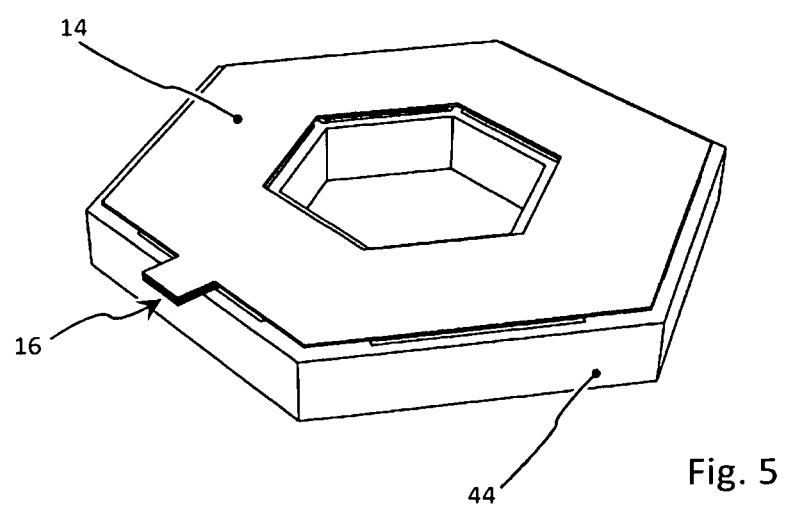
FIG. 5 shows in perspective illustration the power semiconductor module in accordance with FIG. 4, the second main electrode likewise being shown.

FIG. 5 shows the power semiconductor module 10 shown in FIG. 4, the second main electrode being placed onto the frame 44 and also onto the contact terminal 16. As a result of the placement, the contact elements 26 come into electrical contact with the second main electrode 14.

Hexagonal power semiconductor modules were described in the embodiments above. It goes without saying that the power semiconductor module can have an arbitrary number of vertices, wherein the number of vertices could typically be greater than or equal to 3 and less than 10, but also greater. The greater the number of vertices, the more the n-gonal embodiment approximates to the first embodiment.

In the case of an n-gonal embodiment, too, the power semiconductor components of the corresponding ring arrangement lie at least approximately along a first circular line. However, the first circular line 30 can also be approximated by a first polygon 31 having the same number of vertices. The second circular line 34 of the ring arrangement can likewise be approximated by a second polygon 35 having the same number of vertices.

In a further embodiment, not shown in the figures, the electrical connection between the control terminal 16 and each control electrode 24 has a resistance.

The active assemblies 42 of the power semiconductor module 10 are embodied in each case identically in the embodiments described above and shown in the figures. In order to approximate the described ring structure as far as possible to an annulus, it can also be expedient to use two or more types of assemblies 42 that are constructed geometrically differently. By way of example, the form of the carrier plate can be varied and the number of power semiconductor components arranged thereon can be adapted thereto.

What is claimed is:

1. A power semiconductor module comprising:
a first main electrode, a second main electrode, and a control terminal, controllable power semiconductor components arranged between the first main electrode and the second main electrode, wherein each controllable power semiconductor component has a first electrode, a second electrode and a control electrode, and the first electrode of each controllable power semiconductor component is electrically connected to the first main electrode, the second electrode of each controllable power semiconductor component is electrically connected to the second main electrode, and the control electrode of each controllable power semiconductor component is electrically connected to the control terminal, wherein the controllable power semiconductor components are arranged in a plurality of ring arrangements, and
an electrically conductive contact element arranged between the second main electrode of the power semiconductor module and each controllable power semiconductor component, said contact element connecting the second main electrode to the second electrode of the power semiconductor component, wherein the contact element and the power semiconductor component define a current carrying direction that is at least approximately at right angles with respect to the first main electrode,
wherein each ring arrangement of the plurality of ring arrangements has the respective controllable power semiconductor components arranged at least approximately along a first circular line as well as a control conductor track which is arranged on the first main electrode and runs at least approximately along a second circular line, the second circular line of the respective ring arrangement runs concentrically and outside relative to the first circular line of the respective ring arrangement, wherein all of the controllable power semiconductor components are arranged in the plurality of ring arrangements, wherein the control electrode of each controllable power semiconductor component of the respective ring to the control conductor track of the respective ring arrangement, and the control conductor track of the respective ring arrangement is connected via a further electrical connection to the control terminal, and wherein the further electrical connection runs at least substantially parallel to the current carrying direction.

2. The power semiconductor module as claimed in claim 1, characterized in that the first circular line of each ring arrangement is approximated by a first polygon, and the associated second circular line of each ring arrangement is approximated by a second polygon having the same number of vertices as the first polygon, wherein the vertices of the first polygon are aligned with the vertices of the second polygon.

3. The power semiconductor module as claimed in claim 1, characterized in that the power semiconductor module has active assemblies, each active assembly has a carrier plate, and the carrier plates of the active assemblies together form the first main electrode, wherein each ring arrangement is divided into ring segments defined by the active assemblies, wherein the controllable power semiconductor components of the ring segment are arranged on the carrier plate, and wherein the control conductor track of each ring arrangement is subdivided into control conductor track segments defined by the ring segments, wherein the control electrode of each power semiconductor component of the respective ring segment is connected to the control conductor track segment of the respective ring segment.

4. The power semiconductor module as claimed in claim 1, characterized in that the ring arrangements do not overlap, or are free of overlap.

5. The power semiconductor module as claimed in claim 1, characterized in that the active assemblies of the power semiconductor module are all embodied identically.

6. The power semiconductor module as claimed in claim 1, characterized in that each contact element is embodied as a press contact.

7. The power semiconductor module as claimed in claim 3, characterized in that the power semiconductor module has a frame composed of insulating material, the active assemblies being inserted into said frame.

8. The power semiconductor module as claimed in claim 1, characterized in that the power semiconductor module has a central through hole.

9. A power semiconductor module comprising:

a first main electrode, a second main electrode, and a control terminal, controllable power semiconductor components arranged between the first main electrode and the second main electrode, each controllable power semiconductor component having a first electrode, a second electrode and a control electrode, the first electrode of each controllable power semiconductor component being electrically connected to the first main electrode, the second electrode of each controllable power semiconductor component being electrically connected to the second main electrode, and the control electrode of each controllable power semiconductor component being electrically connected to the control terminal, conductor tracks disposed on the first main electrode and insulated therefrom, a plurality of ring arrangements, each ring arrangement having a first circular line and a second corresponding circular line which concentrically surrounds the first circular line, and an electrically conductive contact element arranged between the second main electrode of the power semiconductor module and each controllable power semiconductor component, said contact element connecting the second main electrode to the second electrode of the power semiconductor component, wherein the contact element and the power semiconductor component define a current carrying direction that is at least approximately at right angles with respect to the first main electrode, wherein each controllable power semiconductor component is arranged at least proximate along the respective first circular line of one of the plurality of ring arrangements and wherein each conductor track is arranged at least proximate along the respective second circular ring of one of the plurality of ring arrangements, wherein for each ring arrangement, the control electrode of each controllable power semiconductor component in the respective ring arrangement is connected via an electrical connection to the control conductor track and the control conductor track is connected to the control terminal via a further electrical connection, and wherein the further electrical connection runs at least substantially parallel to the current carrying direction.

* * * * *